United States Patent [19]

Sakurai

[11] 4,404,735
[45] Sep. 20, 1983

[54] METHOD FOR MANUFACTURING A FIELD ISOLATION STRUCTURE FOR A SEMICONDUCTOR DEVICE

[75] Inventor: Junji Sakurai, Tokyo, Japan

[73] Assignee: Fujitsu Limited, Kawasaki, Japan

[21] Appl. No.: 263,280

[22] Filed: May 13, 1981

[30] Foreign Application Priority Data

May 14, 1980 [JP] Japan .................................. 55-63573

[51] Int. Cl.³ ........................................... H01L 21/95
[52] U.S. Cl. .................................... 29/576 W; 29/580; 148/1.5; 357/49; 357/55
[58] Field of Search ............. 29/576 W, 580; 427/93; 357/49, 50, 55; 148/1.5; 219/121 L, 121 LE, 121 LF, 121 LM

[56] References Cited

U.S. PATENT DOCUMENTS

| | | | |
|---|---|---|---|
| 4,204,894 | 5/1980 | Komeda et al. .................. | 29/578 X |
| 4,233,091 | 11/1980 | Kawabe ....................... | 29/576 W X |
| 4,269,636 | 5/1981 | Rivoli et al. ................. | 29/576 W X |
| 4,284,659 | 8/1981 | Joccodine et al. ....... | 219/121 LF X |

FOREIGN PATENT DOCUMENTS

| | | | |
|---|---|---|---|
| 54-22168 | 2/1979 | Japan ................................ | 29/576 W |
| 55-72052 | 5/1980 | Japan ................................ | 29/576 W |

*Primary Examiner*—L. Dewayne Rutledge
*Assistant Examiner*—Alan E. Schiavelli
*Attorney, Agent, or Firm*—Staas & Halsey

[57] ABSTRACT

A method for forming a field isolation structure for a semiconductor device, in which a groove is formed in a semiconductor substrate, an insulating layer is formed on the substrate at least in the groove, a glass layer or a silicon layer is formed thereon, and thereafter a high energy beam such as a laser beam is irradiated onto the glass or silicon layer to selectively heat the same thereby to melt or fluidify the layer and let the same flow into the groove is disclosed. A smooth and flat surface is obtained through the above melting process, which also prevents electrical breaks in wiring layers formed thereon. The method is particularly suited to producing small field isolation structures thus improving the integration density of the device.

9 Claims, 19 Drawing Figures

METHOD FOR MANUFACTURING A FIELD ISOLATION STRUCTURE FOR A SEMICONDUCTOR DEVICE

BACKGROUND OF THE INVENTION

1. Field of the Invention

This invention relates to a method for manufacturing a semiconductor device having a semiconductor substrate, a plurality of active elements such as bipolar transistors or Metal-Insulator-Semiconductor (MIS) type transistors formed in the substrate and an isolation region formed on the substrate for isolating the active elements from one another. More particularly, the invention relates to a method for forming a small field isolation structure on a semiconductor substrate for an integrated circuit device.

2. Description of the Prior Art

In a semiconductor integrated circuit device, a plurality of active elements or functional elements formed in a semiconductor substrate are electrically isolated from one another by a field isolation system. The region for the field isolation is comprised of a deep impurity diffusion region, or a thermally grown thick oxide film for conventional devices. The problem with the conventional field isolation structure is that hours of high temperature processing are necessary for the formation of the isolation structure, and fine patterning of the field region is difficult. The latter problem is difficult to solve due to the fact that either impurity diffusion or thermal oxidation for forming the field region is controlled by a diffusion phenomenon and accordingly the width of the region can not be narrower than its depth. In order to solve these problems, insulator isolation structures in which a groove is formed on a surface of a substrate where the isolation region is to be formed and an insulator or semiconductor material is filled therein have been proposed. Such a groove, if formed by a conventional anisotropic etching technique or a dry etching technique, can have a smaller width than its depth. This means that the isolation structure can be miniaturized to achieve a high integration density. Moreover, if a convention chemical vapor deposition (CVD) technique is employed to form the insulator or semiconductor layer for filling the groove, a high temperature as in the impurity diffusion or thermal oxidation process is not required. For these advantages, various processes for forming the insulator isolation structure as explained above have been proposed and tried. However, most of them have not succeeded because of the fatal disadvantage that a polishing or lapping process is necessary to remove the insulator or semiconductor layer on the substrate except in the groove. This lapping process to remove only the insulator or semiconductor layer on the substrate has a poor reproducibility and is difficult to be carried out without damaging the substrate.

SUMMARY OF THE INVENTION

It is the primary object of this invention to provide a method for forming a field isolation structure having a small width thereby to improve the integration density of an integrated circuit device.

The other object of this invention is to provide a method for forming a field isolation structure without long periods of high temperature heat treatment.

A further object of this invention is to provide a method for forming a field isolation structure wherein the surface of the substrate is made flat without any polishing or lapping process.

Still a further object of this invention is to provide a method for forming a field isolation structure on a substrate which does not thermally damage the active elements formed in the substrate.

The present invention provides a method for manufacturing a semiconductor device having a semiconductor substrate, a plurality of active elements formed in the substrate and a field isolation region formed on the substrate for isolating the active elements from one another, the method comprises the following steps.

First forming a groove for the formation of the field isolation region in the substrate. Then covering the groove with an insulating layer, and forming on the insulating layer, at least in the groove, a layer of a material capable of being fluidified when heated. Finally irradiating the layer of the material with an energy beam, preferably a laser beam, to selectively heat the layer so as to flow into and fill the groove.

The groove for forming the field isolation region may preferably be formed by an anisotropic etching technique, or a dry etching technique as is well known in the art. Such a groove has a small width relative to its depth which lessens the area for the field isolation structure. A conventional plasma etching, reactive sputter etching or ion beam etching technique is particularly preferable for this purpose. A sufficiently thin insulating layer relative to the depth and width of the groove is formed on the substrate to cover the surface of the substrate at least in the groove. Thereafter, the abovementioned layer of the material is formed on the substrate preferably by a conventional CVD technique. The thickness of this layer is preferably selected to be less than the depth and half of the width of the groove. This layer is formed only in and around the groove.

An impurity containing glass, particularly phosphorus silicate glass (PSG), or silicon is preferably used as the material to be heated of these materials, the use of PSG is preferable, especially in combination with a laser generating an ultra-red laser beam having a wave length of about 10 microns, such as a carbon dioxide gas laser. Such an ultra-red laser beam is not significantly absorbed by the substrate silicon, but is absorbed by the PSG thereby selectively heating and melting the PSG layer formed in the groove on the substrate. When silicon is employed to fill up the groove, a laser beam generated from, for example, a YAG laser or argon laser may be used to heat the silicon layer in the groove. In this case, most of the energy of the laser beam is absorbed at the surface portion of the silicon layer when the beam is irradiated thereon, and the silicon layer begins to melt at its surface portion. Thus, the silicon layer can be melted without substantially heating the silicon substrate thereunder. In any case, the insulating layer formed under the glass layer or silicon layer is useful to prevent the substrate from contacting with the melted glass or silicon so that any thermal damage to the substrate or active elements formed therein is avoided. Moreover, this insulating layer prevents an impurity contained in the glass layer from being diffused into the substrate. This avoids the production of an undesirable impurity diffusion region in the substrate. When a silicon layer is formed in the groove, the underlying insulating layer is also useful to electrically isolate the silicon layer from the substrate so that isolation is achieved. This insulating layer may be a thermally grown silicon dioxide formed on the silicon substrate having a thickness of more than 500 angstroms. This thickness is sufficient to prevent thermal damage to the substrate, and to block the impurity diffusion from the glass layer during the fluidifying or melting of the glass layer by a high energy beam such as a laser beam because the melting lasts only a very short period of time, for example, less than 10 micro-seconds. A silicon dioxide film having a thickness of more than 500 angstroms is also sufficient to assure isolation between the substrate and the silicon layer in the groove.

When the glass or silicon layer in the groove is selectively heated up to a sufficiently high temperature to fluidify or melt the glass or silicon, the layer begins to flow into the groove and ultimately fills it up thus making the surface flat and smooth. During this melting step, the surface tension of the molten layer rather than gravity is the dominant mechanism causing the flow of the material so that the surface becomes flat and smooth very quickly. Therefore, it is sufficient to only melt the layer for several micro-seconds in order to obtain a desirable flat surface. Thus a flat and smooth surface suitable for the formation of a wiring layer thereon, without the risk of electrical breaks in the layer, is obtained without a grinding or lapping process.

Unlike the conventional method for forming an isolation structure, the formation of the field isolation region in accordance with the present invention may be carried out even after active regions for active elements have already been formed in the substrate because these regions are not thermally damaged even in the melting step described above. Yet, the material filling in the groove has an excellent isolation property because it comprises a CVD insulator or silicon and is sufficiently annealed during the melting step to become dense. The isolation structure formed by the present invention is applicable not only to bipolar type integrated circuit devices but also to MIS type devices.

BRIEF DESCRIPTION OF THE DRAWINGS

These and other objects and advantages of this invention may best be understood by reference to the following detailed description of preferred embodiments when read in conjunction with the accompanying drawings, wherein.

DESCRIPTION OF THE PREFERRED EMBODIMENTS

Figure 1:
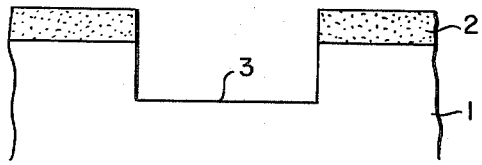
FIG. 1 to FIG. 4 are cross sectional diagrams of a semiconductor substrate illustrating the basic process of forming an isolation region according to the present invention.
Figure 3:
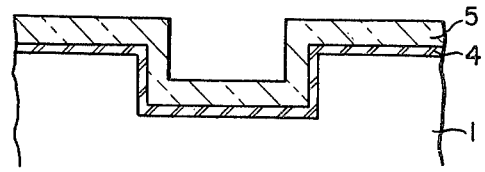
Figure 2:
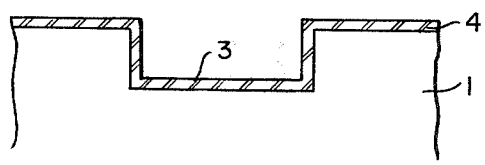
Figure 4:
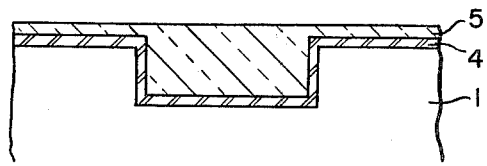

Referring to FIGS. 1 to 4, the basic process of this invention is explained hereinafter. In the first step, a silicon substrate 1 is prepared and a photoresist layer 2 having a predetermined pattern for forming a groove is formed thereon by a conventional photolithography technique. The groove 3 is formed by, for example, a conventional reactive sputter etching technique, with the photoresist layer 2 used as an etching mask as shown in FIG. 1. The dimension of the groove depends on the type of the device to be manufactured as in the case of the conventional isolation structure. After the removal of the photoresist, the substrate is subjected to a thermal oxidation treatment to form a silicon dioxide film 4 having a thickness of 500 to 1000 angstrom on the surface of the substrate 1, as shown in FIG. 2. This oxide film 4 in the groove 3 functions as a blocking film to prevent any undesirable thermal damage to or impurity diffusion into the substrate during later processing steps. Thereafter, for example, a PSG layer 5 is formed on the substrate by a conventional CVD technique. The thickness of this layer 5 should be less than the depth of the groove 3 and also less than half of its width as shown in FIG. 3 so that the layer 5 does not completely fill up the groove at this stage. The layer 5 may be selectively removed so as to remain only in the groove 3 and at its fringe. Next, a laser beam such as a carbon dioxide laser beam having a wavelength of 10.6 microns is irradiated from above onto the PSG layer 5 to melt and fluidify the PSG layer 5. The optimum condition of the irradiation energy depends on the thickness of the layer 5. However, this condition is not critical because the laser beam is not substantially absorbed by the substrate but is absorbed by the PSG layer 5 to selectively heat the PSG layer. Moreover, the PSG layer 5 tends to melt more at the thick portion; that is, in the groove 3 where the fluidifying of the layer 5 is necessary because the absorption of the beam is greater in this portion. Thus the PSG layer 5 is fluidified and flows into the groove 3 due to its surface tension and its surface becomes smooth and flat as shown in FIG. 4. In this melting step, the thermally grown oxide film 4 prevents the diffusion of phosphorous, which is an n type impurity, into the substrate 1 from the PSG layer 5. In addition, any substantial thermal damage to the substrate or active elements therein by the molten PSG layer is prevented by this blocking film 4.

Figure 5:
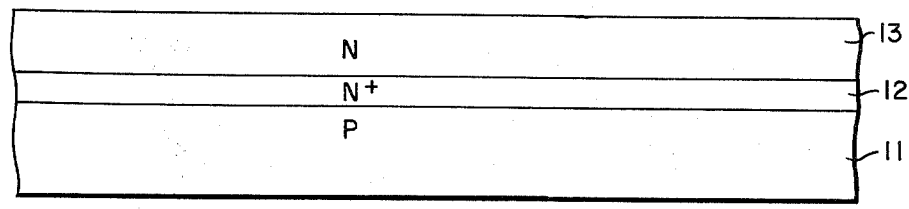
FIG. 5 to FIG. 12 are cross sectional diagrams of a portion of a substrate illustrating a preferred embodiment of the present invention for manufacturing a bipolar type integrated circuit.

A preferred embodiment of the present invention for manufacturing a bipolar type integrated circuit device is described with reference to FIG. 5 to FIG. 12. First, in a P type silicon substrate 11 having a specific resistivity of 0.1 to 0.01 ohm-cm, an N type layer 12 having an impurity concentration of $5 \times 10^{19} \sim 1 \times 10^{20}$ cm$^{-3}$ is formed by a conventional process for diffusing antimony. This layer 12 becomes a so-called buried diffusion layer. Unlike in the conventional process, this buried diffusion layer 12 may be formed continuously on the entire surface of the substrate 11. Thereafter, an N type silicon epitaxial layer 13 containing phosphorus as the N type impurity in the concentration of $5 \times 10^{14}$ cm$^{-3}$ is formed on the substrate by an ordinary epitaxial growth process. The resultant cross section of the substrate is shown in FIG. 5.

Figure 6:
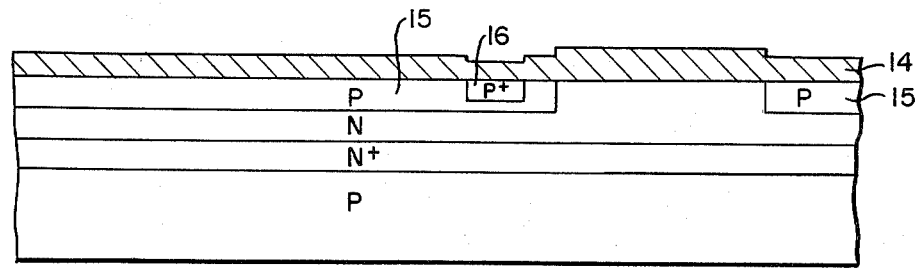
Figure 7:
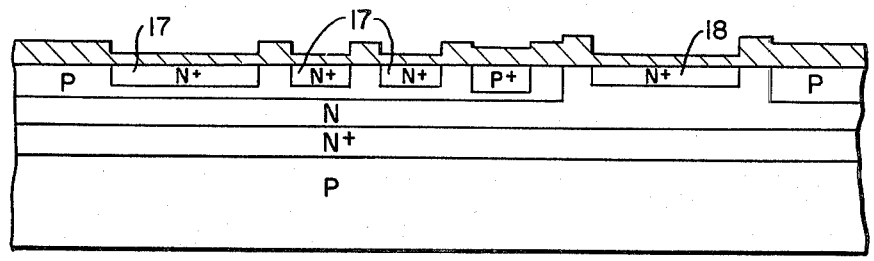

In the processing for this embodiment, the formation of regions for active elements in the substrate is carried out prior to the formation of the isolation region. However, these steps are essentially the same as those in the conventional process. Referring to FIG. 6, a silicon dioxide film 14 is formed on the substrate, P type base regions 15 and base contact regions 16 of high impurity concentration are formed successively in the epitaxial layer 13 by conventional impurity diffusion processes with the oxide film 14 used as a diffusion mask. Next, emitter regions 17 and collector regions 18 are formed by diffusing a high concentration N type impurity as shown in FIG. 7. Thus, the formation of active regions in the substrate for forming active elements is completed.

Figure 8:
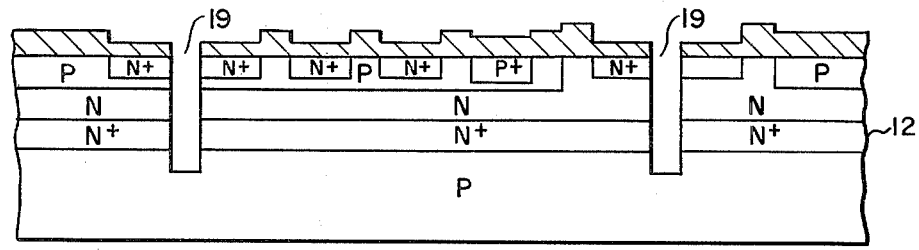
Figure 9:
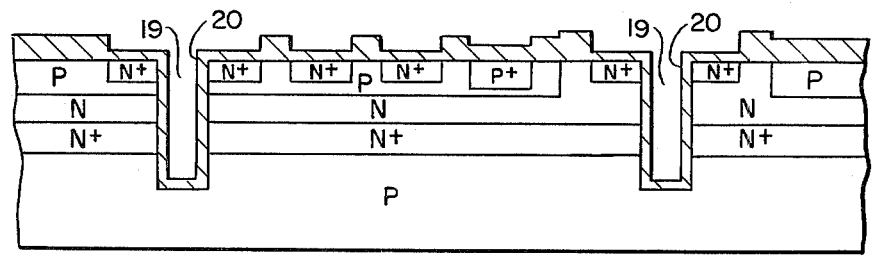
Figure 10:
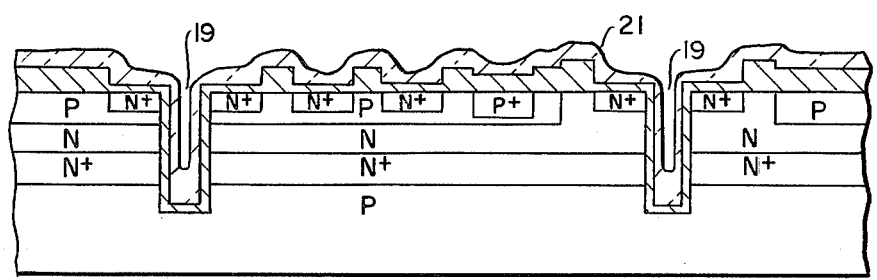

After the process steps described above, isolation regions are formed in the substrate as explained below. First, a groove 19 is formed in the substrate where the isolation region is to be formed, as shown in FIG. 8, by a conventional reactive sputter etching technique with a photoresist film used as a mask. The groove 19 should be deep enough to penetrate the buried diffusion layer 12 and thus completely isolate island-shaped N type collector regions from one another. Then, the substrate is subjected to a thermal oxidation treatment to form a silicon dioxide film 20 having a thickness of 500 to 1000 angstrom on the exposed silicon surface in the groove 19 as shown in FIG. 9. In FIG. 10, a PSG layer 21 is formed on the substrate by a conventional CVD method. This PSG layer 21 should have a thickness less than the depth of the groove 19 and also less than half of the width of the groove 19. Typically, the groove 19 in a bipolar type device, such as in this embodiment, is relatively deep, for example as deep as 5 to 10 microns. On the other hand, it may be made sufficiently narrow to save the area. Assuming that the width of the groove 19 is 4 microns, the appropriate thickness of the PSG layer 21 is about 1.5 microns.

Figure 11:
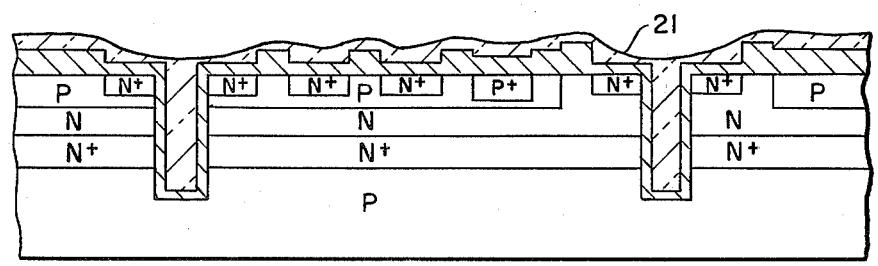

Then a laser beam generated by a carbon dioxide pulse laser is applied on the PSG layer 21, from above, to melt or fluidify the layer 21. For example, the irradiation energy is 4 to 5 joule/cm$^2$ with the pulse width of 5 micro sec. and the diameter of the laser spot of 1 mm. The beam is preferably scanned with a pitch of 0.5 mm so that adjacent spots partially overlap one another. The PSG layer 21 is melted instantaneously by the irradiation of the laser beam and immediately flows into the groove 19 due to the surface tension of the melted PSG layer. In this step, the blocking oxide film 20 prevents any substantial diffusion of phosphorus from the PSG layer into the substrate, because the laser beam heating lasts only a very short period of time. As a result of this melting step, a smooth and flat surface as shown in FIG. 11 is obtained on the substrate. Thus the formation of the isolation region is completed.

Figure 12:
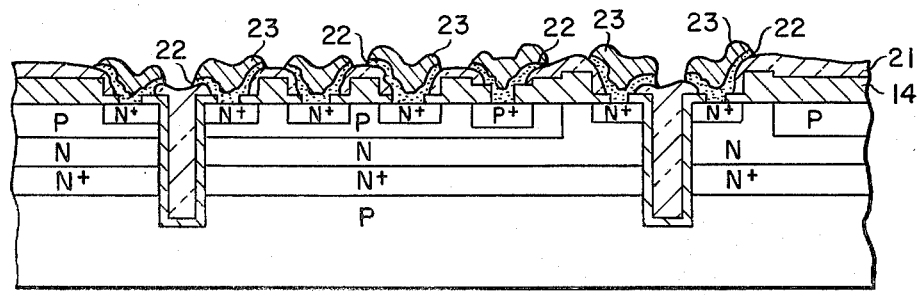

The succeeding processing steps are the same as those of the conventional process, in which electrode windows are formed in the insulator layers on the substrate, a polycrystal silicon layer of about 400 angstrom and an aluminium layer of 5,000 to 10,000 angstrom are successively formed thereon, and patterning of the silicon and aluminum layers is carried out to form electrodes or wires for the integrated circuit. The resultant structure is shown in FIG. 12 in which 22 is the silicon layer and 23 is the aluminium layer. The wiring comprised of the both layers, though not shown in the Figure, extends over the groove 19 on the PSG layer 21 without a potential risk of disconnection due to steep steps which would otherwise exist on the isolation region, i.e. on the groove 19.

Figure 13:
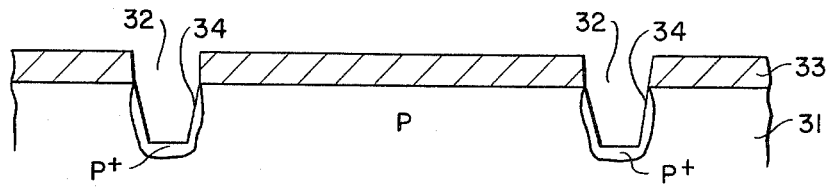
FIG. 13 to FIG. 19 are cross sectional diagrams of a portion of a substrate illustrating a preferred embodiment of the present invention for producing an MIS type integrated circuit.

With reference to FIG. 13 to FIG. 19, a preferred embodiment of this invention for manufacturing an MIS type integrated circuit device is described hereinunder. First, a groove 32 having a depth of, for example, 1 to 2 microns is formed in a P type silicon substrate 31 at a portion where an field isolation region is to be formed with a photoresist film 33 used as an etching mask. The substrate has a crystallographic surface orientation of (100) on its major surface and the abovementioned etching may be carried out by a well known anisotropic etching method so that (111) surface is exposed and the width of the groove 32 relative to its depth can be made small. However, other etching techniques may be employed to form the groove 32. The photoresist film 33 is also used as a mask during the ion implantation process for forming a channel stop or channel cut region 34 in the substrate 31 at the portion under the groove 32. The implantation of boron ions forms the channel cut region 34, as shown in FIG. 13.

Figure 14:
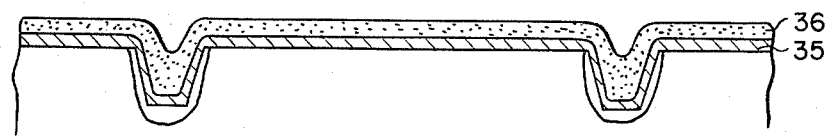

After removing the photoresist film, the substrate is subjected to a thermal oxidation treatment to form a silicon dioxide film 35 having a thickness of 500 to 1,000 angstrom on the entire surface of the substrate. Then, a polycrystal silicon layer 36 is formed on the substrate as shown in FIG. 14. The silicon layer 36 has a thickness of, for example, 0.5 to 1 micron which is preferably less than half of the width of the groove 32, as in the preceeding embodiment.

Figure 15:
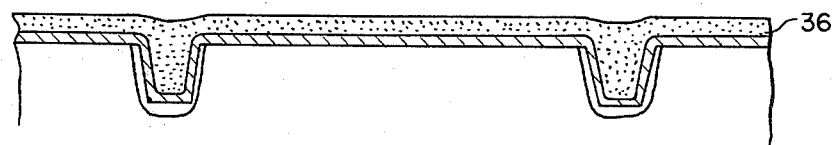

Onto the silicon layer, a laser beam from a CW argon laser is irradiated to selectively heat and melt the same. An example of the optimum irradiation condition is as follows. The argon laser has an output power of from 10 to 15 W, a beam spot diameter of 50 microns, a scanning speed of 10 cm/sec and a scanning pitch of 25 microns. During this irradiation step, the oxide film 35 thermally insulates the substrate 31 from the molten silicon layer, so that no part of the substrate is melted. The molten silicon flows into the groove due to surface tension, thus making the surface smooth and flat as shown in FIG. 15.

Figure 16:
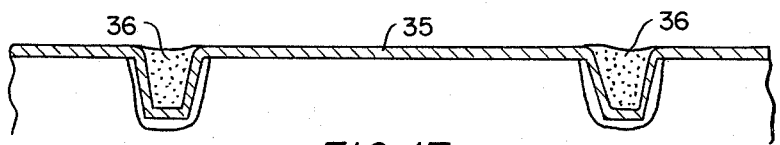
Figure 17:
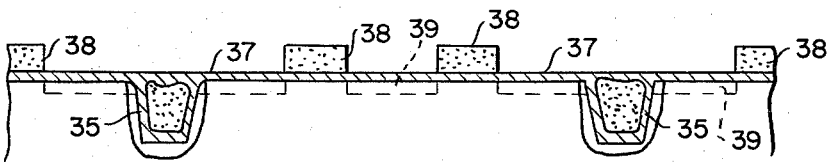

The silicon layer 36 is then etched until the underlying oxide film 35 is exposed except in the groove as shown in FIG. 16. The exposed oxide film is also etched off and then the substrate is subjected to a thermal oxidation treatment to form the gate oxide film 37. The surface of the remaining silicon layer 36 in the groove is also oxidized so that the silicon layer 36 is completely surrounded by the oxide films 35 and 37. An implantation of boron ions into the substrate through the oxide film 37 may be executed at this stage to adjust the threshold voltage of the MIS transistors. Another polycrystal silicon layer, forming gate electrodes 38, is formed by an ordinary CVD technique on the oxide film 37 and is patterned via a conventional photoetching technique to form gate electrodes 38 as shown in FIG. 17. Then, phosphorus ions are implanted through the oxide film 37 to form phosphorus doped to block source and drain regions 39 with the polycrystal silicon layer 38 used as a mask to block the ions. The ions implanted into the silicon layer 38 increase the conductivity of the layer 38.

Figure 18:
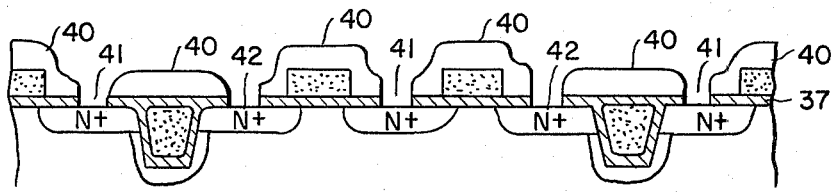
Figure 19:
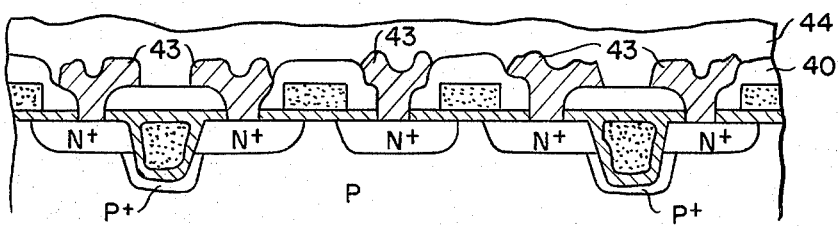

A PSG layer 40 is formed on the substrate, and contact windows 41 for the source and drain are formed through the PSG layer 40 and the oxide film 37 as shown in FIG. 18. The substrate is then subjected to an annealing treatment to diffuse the implanted phosphorus ions, thus forming N type source and drain regions 42. Thereafter, aluminium electrodes 43 are formed, and a cover PSG layer 44 is formed thereon as in the conventional device. The completed integrated circuit device including MIS type transistors each isolated by the field isolation structure is shown in FIG. 19.

What is claimed is:
1. A method for manufacturing a semiconductor device having a semiconductor substrate, a plurality of active elements formed in said substrate and an isolation region formed in said substrate for isolating said active elements from one another, the method comprising the steps of;
  forming a groove in said substrate defining said isolation region,
  covering said groove with an insulating layer, forming on said insulating layer at least in said groove a layer of a material capable of being fluidified when heated, and irradiating said layer of said material with an energy beam to selectively heat said layer of said material and permit the same to flow into said groove, thereby to fill up said groove with said material.

2. The method according to claim 1, wherein said energy beam is a laser beam.

3. The method according to claim 1, wherein said material consists of a glass.

4. The method according to clalim 1, wherein said material consists of phosopho-silicate glass.

5. The method according to claim 4, wherein said energy beam is a carbon dioxide gas laser beam.

6. The method according to claim 1, wheren said material consists of silicon.

7. The method according to claim 1, wherein said insulating layer consists of silicon dioxide.

8. The method according to claim 1, wherein the thickness of said layer of said material is less than the depth of said groove.

9. The method according to claim 1, wherein the thickness of said layer of said material is less than half the width of said groove.

* * * * *

UNITED STATES PATENT AND TRADEMARK OFFICE
CERTIFICATE OF CORRECTION

PATENT NO. : 4,404,735

DATED : September 20, 1983

INVENTOR(S) : SAKAURAI

It is certified that error appears in the above-identified patent and that said Letters Patent is hereby corrected as shown below:

[56], Front page, References Cited, "Joccodine" should be --Jaccodine--;

Column 2, line 39, after "heated" insert --,--; change "of" (first occurrence) to --Of--;

Column 6, line 43, delete last "to";
line 44, delete "block";

Column 7, line 12, "clalim" should be --claim--.

Signed and Sealed this

Twenty-ninth Day of May 1984

[SEAL]

Attest:

GERALD J. MOSSINGHOFF

Attesting Officer

Commissioner of Patents and Trademarks